United States Patent [19]
Castéra

[11] Patent Number: 4,571,562
[45] Date of Patent: Feb. 18, 1986

[54] TUNABLE SELECTIVE DEVICES BASED FOR MAGNETOSTATIC VOLUME WAVES

[75] Inventor: Jean-Paul Castéra, Orsay, France

[73] Assignee: Thomson-CSF, Paris, France

[21] Appl. No.: 614,148

[22] Filed: May 25, 1984

[30] Foreign Application Priority Data

May 27, 1983 [FR] France .................... 83 08829

[51] Int. Cl.[4] .................... H03H 9/00; H03H 9/24
[52] U.S. Cl. .................... 333/186; 310/26; 333/147; 333/219
[58] Field of Search .................... 333/141–149, 333/150–156, 193–196, 219, 201, 246, 24.1, 24.2, 24.3; 331/107 A; 310/26, 313 R, 313 A, 313 B, 313 C, 313 D

[56] References Cited
U.S. PATENT DOCUMENTS 4,318,061 3/1982 Castéra et al. .................... 333/153

OTHER PUBLICATIONS

Electronics International, vol. 56, No. 1, Jan. 1983, pp. 85–86, New York, R. T. Gallagher.
1979 IEEE MTT–S International Microwave Symposium Digest, pp. 157–159, N.Y., J. P. Castera.
1979 International Symposium on Circuits and Systems Proceedings, 17–19, Jul. 1979, pp. 568–571, Tokyo, J. M. Owens et al.

Primary Examiner—Marvin L. Nussbaum
Attorney, Agent, or Firm—Oblon, Fisher, Spivak, McClelland & Maier

[57] ABSTRACT

The invention relates to tunable selective devices based on magnetostatic volume waves and has as its object to provide a device comprising two resonator networks arranged to exchange magnetostatic volume waves via a selective return reflector network, in which the reflector network is devised so as to eliminate the longitudinal intereference modes present around the required longitudinal mode. The invention is applicable in particular to the filtering of electrical signals at very high frequency, to the production of tunable oscillators and to the measurement of magnetic fields.

8 Claims, 7 Drawing Figures

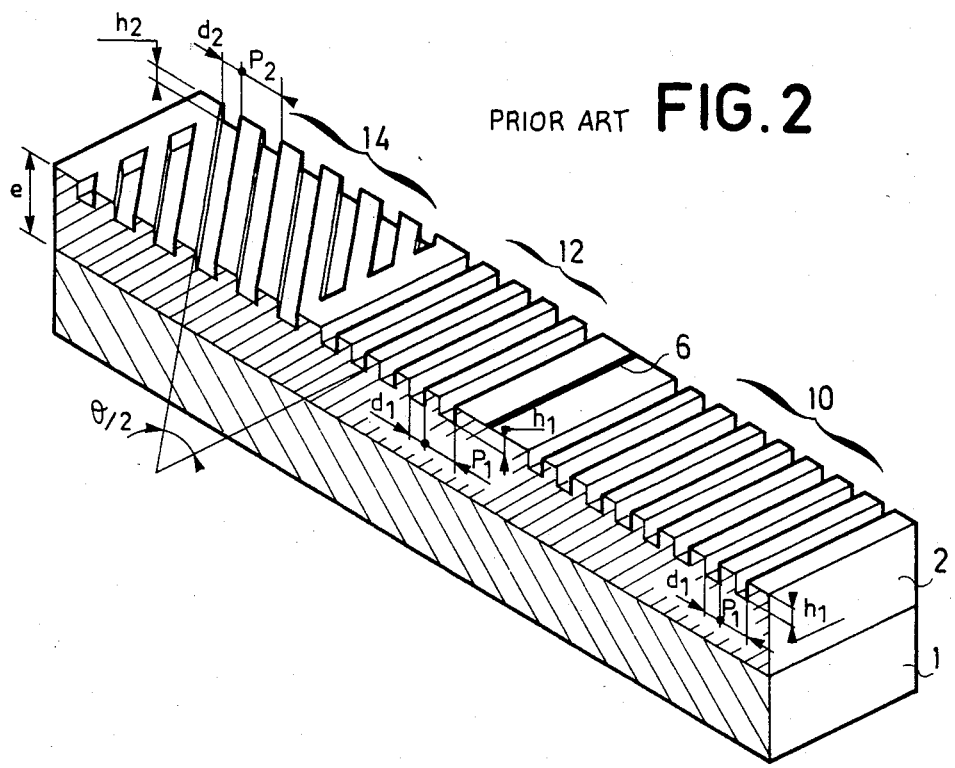
PRIOR ART FIG. 2
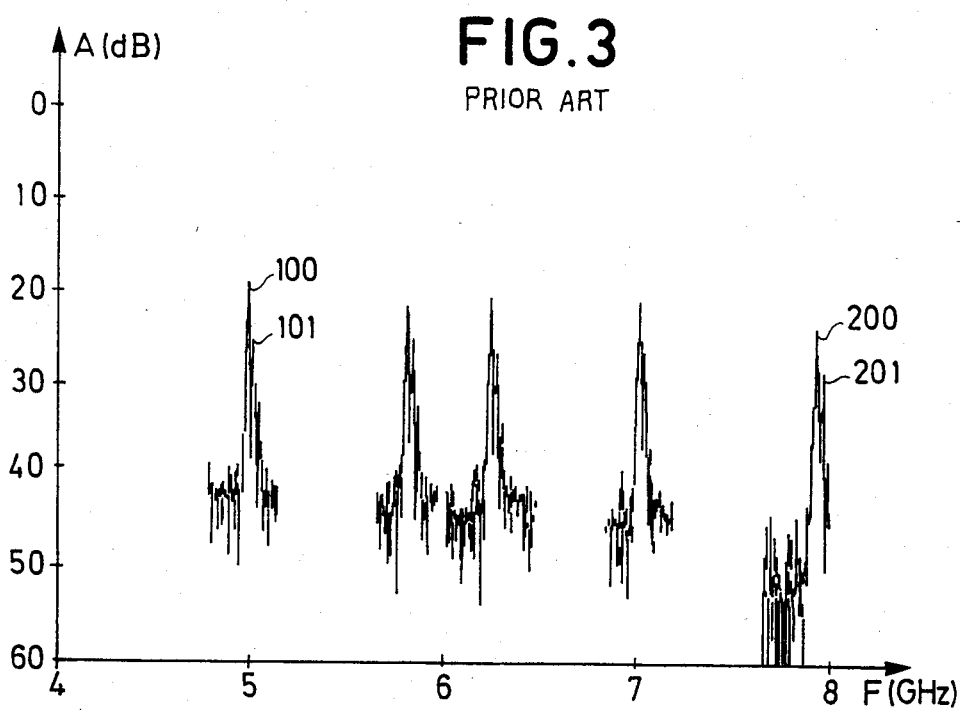
FIG. 3
PRIOR ART

TUNABLE SELECTIVE DEVICES BASED FOR MAGNETOSTATIC VOLUME WAVES

BACKGROUND OF THE INVENTION

The present invention relates to tunable selective devices based on the transmission and receiption of progressive magnetostatic volume waves. These waves are normally propagated by a magnetic layer deposited on a non-magnetic substrate. The selective characteristics are obtained by forming resonant cavities at the surface of the magnetic layer which are delimited by grids or networks of grooves or filamentary regions having been exposed to an ionic implantation. The ondulatory cascade coupling between two resonant cavities, each equipped with a microstrip permits selective transmission of an electrical signal at high frequency being performed within a very narrow frequency band. This band may be displaced to perform a tuning action by altering the intensity of a magnetic field perpendicular in direction to the plane of the magnetic layer.

The progressive magnetostatic volume waves have isotropic propagation characteristics in the plane of the magnetic layer and as compared to the magnetostatic surface waves they offer the advantage of a higher saturation level. If it is contemplated to produce a tunable selective device by installing a transmitting microstrip and a receiving microstrip within a resonant cavity, a resonance peak may well be obtained at a given frequency, but the direct coupling formed between the microstrip has the result that the insertion losses observed close to resonance are barely greater than those observed at the apex of the resonance peak.

By arranging in cascade two resonant cavities delimited by parallel reflector networks and each equipped with a microtape, a common mode may be isolated by filtering action, so that a single resonance peak is observed within a substantial frequency range. Nevertheless, the insertion losses at either side of this resonance peak display a comparatively small drop compared to the apex of the resonance peak. This results from insufficient decoupling between the microstrip for the frequencies differing from the resonance frequency.

In order to secure a reduction of the insertion losses, the coupling of the two resonators is provided by a reflector network of which the lines are disposed obliquely with respect to the axes of the resonators. The spacing between the lines of the reflector network is selected in such a manner as to reflect the maximum of energy from one resonator to the other at the wavelength required.

It is observed, however, that the overall transfer function may have interference signals, corresponding to other longitudinal modes of the resonators, close to the resonance peak intended to assure the single-mode operation.

SUMMARY OF THE INVENTION

The invention provides a tunable selective device based on magnetostatic volume waves, comprising a magnetic layer in which is formed at least one resonator having a reflector network associated with a return reflector network external to the resonator comprising grooves cut into the magnetic layer, the said return reflector network assuring the transmission by reflection of magnetostatic waves coming from the said resonator having a reflector network, which moreover establishes a required longitudinal mode, as well as other longitudinal modes bordering the same, characterised in that the reflector network is devised in such a manner that the magnetosatic waves can be reflected by each of its lines, the distance separating the extreme lines being traversed within a given period by the magnetostatic waves; the inverse of this time being representative for the said return reflector network, the said pass band being centred on the said required longitudinal mode and sufficiently narrow to exclude the other longitudinal modes.

BRIEF DESCRIPTION OF THE DRAWINGS

A better understanding of the invention will be gained from the following description and the accompanying drawings, in which:

FIG. 2 is a cross-section of the device of FIG. 1, FIG. 3 is a frequency response curve of the device of FIGS. 1 and 2.

DESCRIPTION OF THE PREFERRED EMBODIMENT

Figure 1:
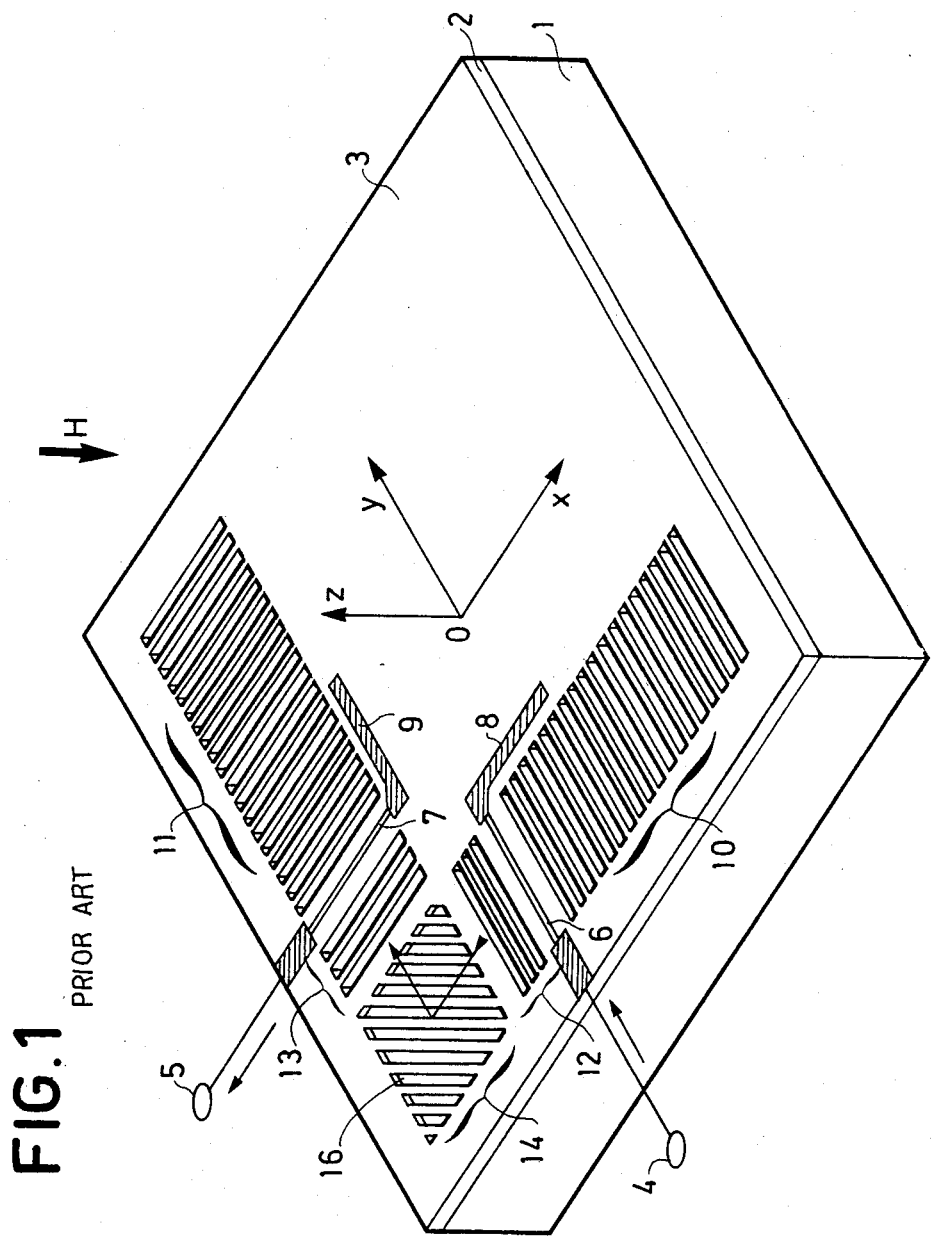
FIG. 1 is an isometric view of a tunable selective device based on magnetostatic waves, of a known type.

FIG. 1 illustrates a resonator comprising two gates 4 and 5, based on the energisation and interception of magnetic waves.

This device comprises for example, a non-magnetic substrate 1 of gadolinium and gallium garnet (GGG) on whose surface has been deposited by epitaxy in the liquid phase a magnetic layer 2 of yttrium and iron garnet (YIG). A trirectangular reference system Oxyz is illustrated in FIG. 1 with its plane oxy parallel to the free surface of the layer 2. The typical thickness of the magnetic layer 2 is 23 microns. Inductive magnetic means, which are not illustrated in FIG. 1, subject the magnetic layer 2 to a magnetic polarising field H directed parallel to the axis Oz.

In these circumstances, it is known that the layer 2 may act as a medium for the propagation of progressive magnetostatic volume waves (OMVF). The characteristics of these waves are the same for all the directions of the plane xoy and they depend on the intensity of the magnetic polarising field.

Grooves have been formed in the magnetic layer 2, for example by ionic machining, whose task is to establish impedance discontinuities intended to reflect the magnetostatic waves. Five reflector netowrks 10,11,12, 13, and 14 have been established in this manner. The lines of the networks 10 and 12 are arranged on the magnetic layer 2 perpendicular to the axis Ox, the lines of the network 14 along the external bisector of the angle xOy.

FIG. 2 illustrates a section of the device of FIG. 1, taken substantially along the axis Ox parallel to the plane zOx. This figure shows the structure of the networks 10,12 and 14. The networks 11 and 13 of FIG. 1 are identical to the networks 10 and 12, respectively. Only these latter and the network 14 will consequently be described.

The networks 10 and 12 comprise identical grooves having a width d1, a spacing p1 and a relative depth h1/e, h1 being the depth of the grooves and e the thickness of the magnetic layer 2.

The spacing p1 is selected as a function of the length $\lambda$ of the magnetostatic waves. For a value $\lambda_o$, each network has an overall maximum reflectivity if $2p1 = k\lambda_o$, with $k = 1,2,3\ldots$ The width d1 of a network line establishes the ratio d1/p1. This ratio may be acted upon to reduce the reflectivity of the network at a wavelength which is a submultiple of that for which maximum reflectivity is sought.

In the case of FIG. 1, it may be assumed, for example, that $p1 = \lambda_o/2$, which is equivalent to establishing a magmetostatic wave frequency $f_{(H)}$ for each intensity of the magnetic field H for polarisation of the layer 2.

The networks 10 and 12 delimit a resonator in which a microstrip 6 is deposited by metallisation on the surface of the layer 2. As is apparent from FIG. 1, the microstrip 6 is connected on the one hand to a metallisation 8 forming an electrical extremity load, and on the other hand to the input connection 4.

The two resonators formed by the networks 10,12 on the one hand and 11,13 on the other hand, are arranged in such manner that their axes, parallel to Ox and Oy respectively, intersect in an area in which extends the network 14.

The network 14 is formed by rectilinear grooves parallel to the external bisector of the angle xOy. There is no need for the angle xOy to be a right angle. The angle subtended by the grooves of the networks 14 and 12 is $\theta/2$.

The spacing p2 of the grooves of the network 14 is given by the relationship:

$$p2 = \frac{\lambda}{2\cos\theta/2}.$$

The width of the grooves is d2 and the depth h2.

The microstrip 6 is traversed by a high frequency current received on its input connection 4. It generates the transmission of magnetostatic waves having rectilinear wavefronts perpendicular to the axis Ox. These magnetostatic waves are reflected by the networks 10 and 12. The network 10 provides almost total reflection, and the network 12 partial reflection. A part of the energy issuing from the resonator 10,12 is reflected by the network 14 towards the resonator 11,13. The network 11 is reflective and the network 13 partially reflective. The conductor 7 carries an electric current whose intensity is a maximum for a particular wavelength characterising the operation of the resonators.

The network 14 is devised for optimum reflection of the waves issuing from the network 12, in order to redirect these towards the network 13, in such a manner as to establish a resonance peak with a minimum insertion loss at its centre. When this wavelength of the magnetostatic waves varies from this central value, the network 14 performs an effective decoupling action between the resonance cavities 10–12 and 11–13.

A device of this kind will be engraved in a magnetic layer of comparatively small thickness e comprised between 10 and 30 $\mu$m. As a matter of fact, the group velocity of the magentostatic volume waves depends on the thickness of the magnetic propagation layer which will consequently be chosen to be small. For other reasons which are implicit in transducer impedance matching problems, in epitaxial conditions and loss problems, it is equally of interest to have a small magnetic layer thickness.

A device will consequently be considered, by way of example, having a magnetic layer thickness e=23 $\mu$m, with networks tuned to a length $\lambda$=150 $\mu$m, and a groove spacing p1=75 $\mu$m for the networks 10 to 13. If the cavities 10–12 and 11–13 are arranged perpendicular ($\theta$=90°), the spacing of the grooves of the network 14 will be p2=106.1 $\mu$m. The relative depth of the grooves h1/e for the networks of the resonant cavities and h2/2 for the reflector networks, will be assumed to be equal to 1.5%. Furthermore, in a magnetic layer of a thickness of 23 $\mu$m, at a frequency of 3 GHz and at a wavelength $\lambda$=150 $\mu$m, the group velocity of the magnetostatic volume waves is v=72.5 Kms/sec.

The response curves of this device are given in FIG. 3 for different frequency values corresponding to different values of the polarising field. The values F of the frequencies in GHz have been plotted as abscissae, and the values A of the insertion losses in dB as ordinates.

A resonance peak 100 with increased insertion losses at either side, is observed at the frequency value 5 GHz. However, an interference peak 101 is present right beside the resonance peak 100.

A resonance peak 200 and an interference mode 201 are equally apparent at the frequency value close to 8 GHz. The same applies for the other frequencies.

These interference signals correspond to longitudinal modes of the two coupled cavities 10–12 and 11–13. The difference between the closest interference mode and the resonance frequence is expressed by:

$$\Delta f = \frac{v}{2L}$$

in which v is the group velocity of the magnetostatic waves at the tuned wavelength of the resonators and L is the equivalent length of each cavity. $\Delta f = 27$ MHz in the case observed.

For the different applications of the magnetostatic wave resonators such as the tunable microwave filters or oscillators, it is necessary that these components should have a single-mode operation.

The object of the present invention consequently consists in combatting the longitudinal interference modes which are closest to the longitudinal mode corresponding to the required single-mode operation. To this end, the invention provides a window having the width $\Delta f_o$, outside which the insertion losses are increased, and defines the value $\Delta f_o$ in such a manner that it is smaller than the difference $\Delta f$ between the longitudinal mode required and the other modes. The definition of this window is established by considering the structure of the reflector network 14 as regards the depth of the grooves and the number of grooves.

Firstly, let it be stated that what is called the pass band $\Delta f_o$ is the reference pass band corresponding to the reciprocal of the transmission period under the reflector network 14, that is to say $\Delta f_o = 1/T$. This pass band is moreover twice the pass band $\delta f$ at half the power value ($\Delta f_o = 2.\delta f$).

Figure 4:
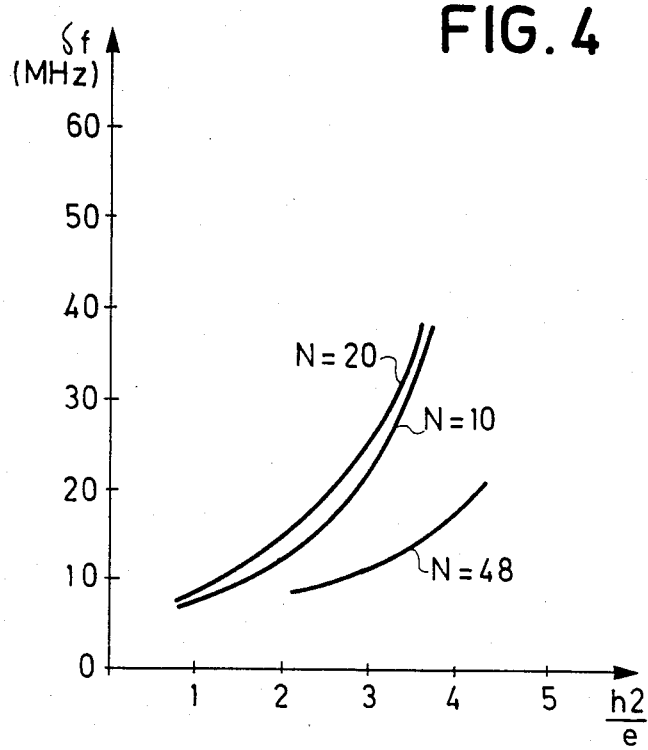
FIG. 4 is an illustration, as a function of the relative depth of the grooves, of curves showing the pass band at half-power of reflector networks comprising 10,20 and 48 lines, respectively.

On a network of the network 14 type, the pass band is thus measured by reflection under normal incidence at half-height as a function of the relative depth of the grooves. FIG. 4 provides curves plotted at a frequency of 3 GHz and a magnetostatic wavelength $\lambda=300$ $\mu$m. The relative depths of the grooves h2/e have been plotted as abscissae, and the band pass $\delta f$ at half-height was plotted as ordinates (in MHz). These curves were plotted for different values of the number N of grooves (N=48, N=10, N=20).

It is apparent from these curves that the pass band at half-height diminishes as the relative depth of the grooves diminishes. The same strongly applies for the reference pass band $\Delta f_o$.

If the results of these curves are applied to the reflector network described previously with the number of grooves N=20, $h_{2/e=1.5\%}$ and $\lambda=300$ $\mu$m, a pass band at half height $\delta f=11.5$ MHz is found on the curve N=20. The reflection pass band is thus $\Delta f_o=23$ MHz.

The following procedure is adopted to extrapolate these results in the case of an operation of the reflector network at the wavelength $\lambda=150$ $\mu$m.

If T is the delay under operation of the network, it was found that $\Delta f_o=1/T$. Furthermore, $T=1/v$, where 1 is proportional to the length of the network and v is proportional to the group velocity. Finally, 1 at the wavelength $\lambda=150$ $\mu$m is half of 1 at the wavelength $\lambda=300$ $\mu$m or: $1_{(\lambda=150 \ \mu m)}=\frac{1}{2}\cdot 1_{(\lambda=300 \ \mu m)}$.

By applying the formula $\Delta f_o=v/1$ at the wavelengths 150 $\mu$m, and 300 $\mu$m, the reference pass band at the wavelength 150 $\mu$m is obtained:

$$\Delta f_{o(\lambda=150 \ \mu m)} = 2 \frac{v_{g(\lambda=150 \ \mu m)}}{v_{g(\lambda=300 \ \mu m)}} f_{o(\lambda=300 \ \mu m)}$$

In this expression, the group velocity at the wavelength $\lambda=150$ $\mu$m is $v_{g(\lambda=150 \ \mu m)}=72.5$ Kms/sec; the group velocity at the wavelength $\lambda=300$ $\mu$m is $v_{g(\lambda=300 \ \mu m)}=109.4$ Kms/sec. Under these conditions, having found the reference pass band at the wavelength $\lambda=300$ $\mu$m, $F_{o(\lambda=300 \ \mu m)}=23$ MHz; the reference pass band at the wavelength $\lambda=150$ $\mu$m is found: $f_{o(\lambda=150 \ \mu m)}=30.5$ MHz.

The difference between the resonance and the closest longitudinal interference mode was found to be equal to 27 MHz.

This study confirms that it is normal to observe the appearance of the mode such as the modes 101 and 201 at a level which is not negligible, on the curves of FIG. 3.

Analogously, the results of these investigations enable one by reverse reasoning to determine the depth of the grooves to be provided to eliminate the longitudinal interference modes.

To this end, one selects a reference pass band lower than 27 MHz, for example of say 24 MHz, at the wavelength $\lambda=150$ $\mu$m. Application of the preceding calculations gives us the reference pass band at the wavelength $\lambda=300$ $\mu$m of $\Delta f_{o(\lambda=300 \ \mu m)}=18$ MHz, which gives a pass band at half height of $\Delta f_{(\lambda=300 \ \mu m)}=9$ MHz. By reference to the curves of FIG. 3 a groove depth h2/e=1% was found for a reflector network 14 comprising 20 grooves.

Furthermore, an investigation still based on reflection perpendicular to the number of grooves forming the network 14, demonstrates that for a given groove depth, the reflective index increases with the number of grooves.

Figure 5:
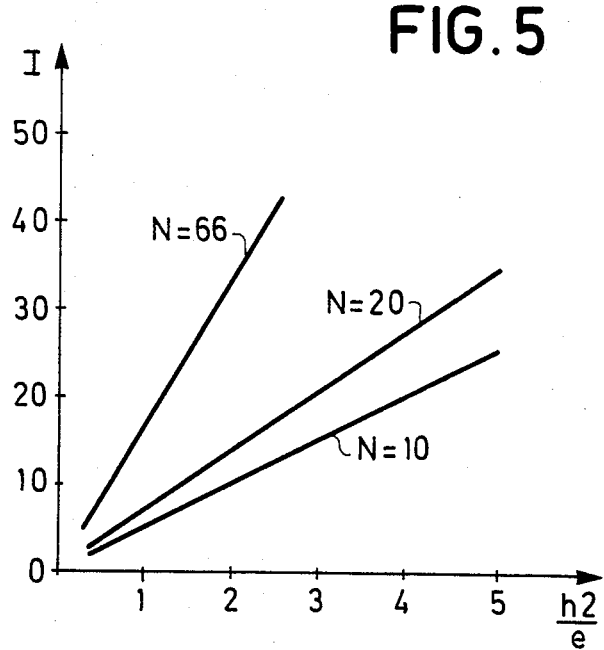
FIG. 5 is an illustraion as a function of the relative depth of the grooves, of curves showing the reflective index of reflector networks comprising 10,20 and 60 lines.

FIG. 5 provides a set of curves plotted at a frequency of 3 GHz and at $\lambda=300$ $\mu$m. The relative depths of the grooves h2/e have been plotted as abscissae and the reflective indices I as ordinates. These curves were plotted for different values of the number of grooves (N=10, N=20, N=66).

The reflective coefficient is calculated from the reflective index by means of the formula:

$$(R)^2 = 1 - 10^{-I/10}$$

For a reflective index I=20, a reflective coefficient R=0.995 will consequently be obtained. A reflective coefficient of R=0.95 will be obtained for a reflective index I=10.

Consequently, it is apparent that it is of interest to provide a large number of grooves for a given relative groove depth.

In the preceding numerical application, it will be suitable, for example, to select in the set of curves, a number of grooves close to N=40, for a relative groove depth of 1%.

A device according to the invention, similar to that described in the foregoing, was engraved with a relative groove depth h1/e=1.37% of the grooves of the networks R10,R11,R12,R13, and a relative depth h2/e=1.1% of the grooves of the networks R14, for a thickness e=19 $\mu$m of the magnetic layer.

Figure 6:
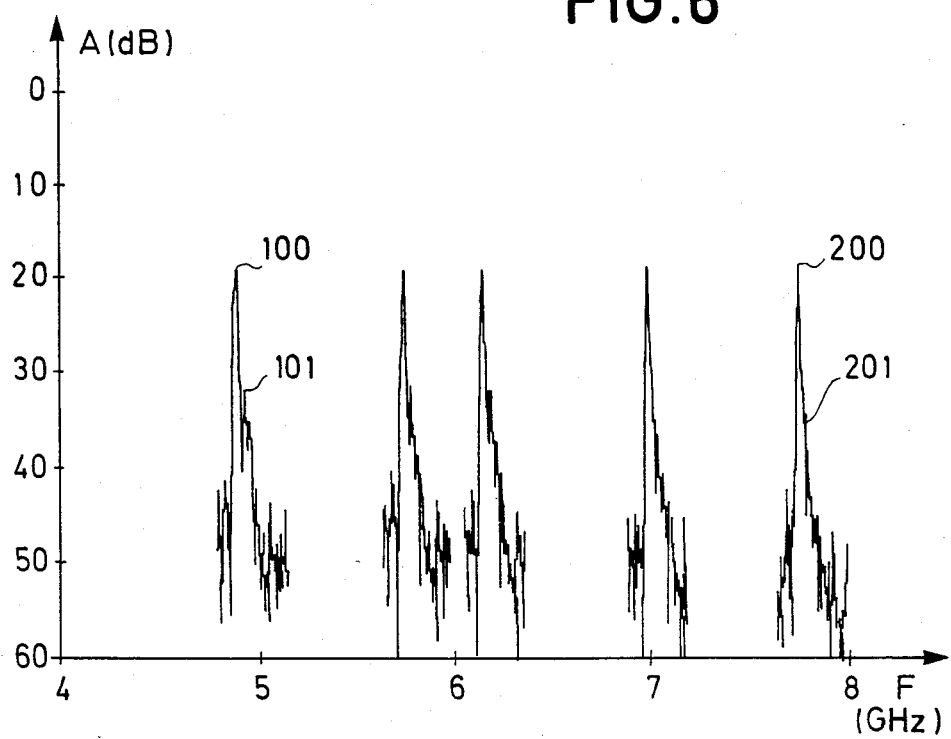
FIG. 6 is a frequency response curve of a device according to the invention.

The operation of this device at a wavelength $\lambda=150$ $\mu$m produces the frequency response curves of FIG. 6. By comparing these graphs with those of FIG. 3, an appreciable attenuation is observed of the longitudinal interference modes closest to the resonance frequencies such as 101 and 201, and this without any notable increase of the losses of the principal mode.

Furthermore, it is observed that the rejection rises as the frequency increases, that is to say the difference between the losses of the principal resonance and that of the longitudinal interference mode. Thus, at 5 GHz, the rejection changes from 5 dB (see FIG. 3) to 13 dB (see FIG. 6), whereas close to 8 GHz, the rejection changes from 5 dB (see FIG. 3) to 16 dB (see FIG. 6).

Figure 7:
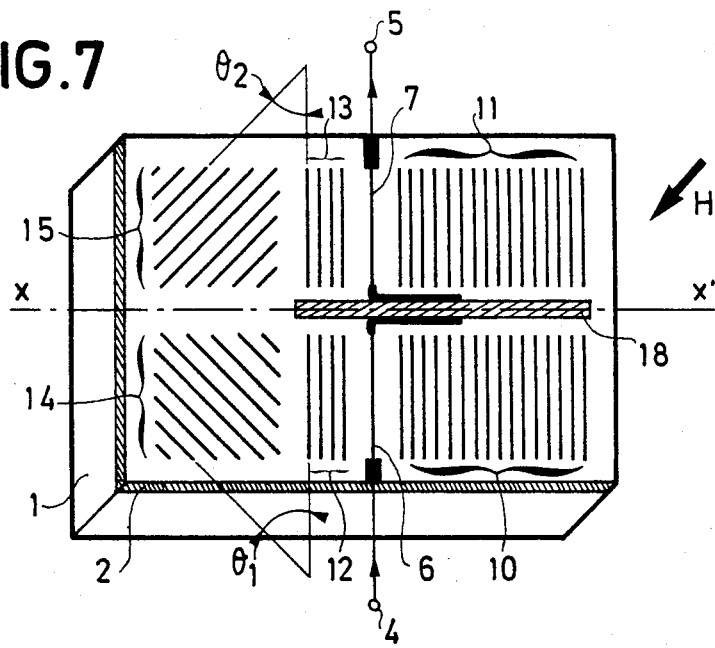
FIG. 7 is an explanatory sketch of a modified embodiment of the invention.

An example of a modified embodiment of the device according to the invention will now be described with reference to FIG. 7.

According to this modified form, the two resonators 10-12 and 11-13 are arranged side-by-side symmetrically with respect to an axis xx'. They are separated by an absorbent area 18 wherein the crystalline structure of the magnetic layer 2 has been disorganised by sand blasting and which decouples the two resonators.

A first reflector network 14 is situated at the output of the network 12. The grooves of the network 14 subtend an angle $\theta_1$ with the grooves of the networks 10 and 12.

A second reflector network 15 identical to the network 14 is situated at the output side of the network 13, in such a manner as to receive the waves reflected by the network 14. The grooves of this network 15 subtend an angle $\theta_2$ with the grooves of the networks 11 and 13.

Furthermore, to the extent that the resonators 10-12 and 11-13 are strictly parallel, the grooves of the networks 14 and 15 should be perpendicular. $\theta_1=\theta_2=45°$ will advantageously be adopted to obtain a symmetrical structure of the device.

A system of this kind offers the advantage that it is more compact that it permits an identical and thus easier production of the resonators 10-12 and 11-13, and of providing a magnetic polarising field H which is uniform and identical for both units.

Moreover, the attenutation of the longitudinal interference modes obtained by the design of the reflector network 14 will be intensified by the presence of the second reflector network 15 of indentical design to that of the former.

Another improvement of the reflector network 14 and, consequently, also of the network 15, consists in providing for the width d2 of the grooves to b equal to the spacing between the grooves, that is to say to have d2=p2/2. In this way, the mode applicable to the resonance corresponding to the wavelength $\lambda/2$ is eliminated.

I claim:

1. A tunable selective device based on magnetostatic volume waves, comprising:
a magnetic layer having at least one resonator formed therein, wherein said at least one resonator has a reflector network formed by first plurality of grooves cut into said magnetic layer and wherein said reflector network is associated with a return reflector network formed by a second plurality of grooves cut into said magnetic layer and wherein said return reflector network is external to said resonator, wherby said return reflector network assures the transmission by reflection of magnetostatic waves output from said resonator having said reflector network in order to establish a required longitudinal mode, as well as other longitudinal modes bordering said required longitudinal mode;
said return reflector network being constructed and devised in such a manner that the magnetostatic waves can be reflected by each of said second plurality of grooves and wherein a reference pass band is formed by said return reflector network so that the period of traversal of said return network by said magnetostatic waves is the reciprocal of said reference pass band; and wherein said pass band is centered on said required longitudinal mode and is sufficiently narrow to exclude said other longitudinal modes.

2. A tunable selective device based on magnetostatic volume waves according to claim 1, wherein the depth of the said second plurality of grooves of the return reflector network is adjusted so as to assure a substantial return of energy for each of the said second plurality of grooves of the said return network.

3. A tunable selective device based on magnetostatic volume waves according to claim 2, wherein the relative depth of the said second plurality grooves of the return reflector network is chosen at a value close to 1% of the thickness of the magnetic layer for a magnetostatic wavelength of 300 microns.

4. A tunable selective device based on magnetostatic volume waves according to claim 2, wherein the number of said second plurality grooves of the return network has been chosen, in relation to the depth of the grooves, at a value such that the reflective properties of the return reflector network are retained for the totality of its lines.

5. A tunable selective device based on magnetostatic volume waves according to claim 1, wherein the width of the said first plurality of grooves of the reflector network is equal to the spacing between the grooves.

6. A tunable selective device based on magnetostatic volume waves according to claim 4, comprising a first resonant cavity and a first reflector network, and equally comprising a second reflector network and a second resonant cavity close to the first resonant cavity, the second reflector network being oriented in such a manner as to receive the magnetostatic waves reflected by the first reflector network and so as to return these towards the second resonant cavity.

7. A tunable selective device based on magnetostatic volume waves according to claim 6, wherein the two resonant cavities have parallel structures, are contiguous, and the grooves of the two reflector networks are oriented along two directions perpendicular to each other.

8. A tunable selective device based on magnetostatic volume waves according to claim 7, wherein the two resonant cavities are decoupled by an absorbent zone.

* * * * *